United States Patent [19]

Pedder et al.

[11] Patent Number: 5,000,819
[45] Date of Patent: Mar. 19, 1991

[54] METAL SURFACE CLEANING PROCESSES

[75] Inventors: David J. Pedder, Warks; Christopher J. Wort, Northants; Kim L. Pickering, Northampton, all of United Kingdom

[73] Assignee: Plessey Overseas Limited, Ilford, England

[21] Appl. No.: 442,797

[22] Filed: Nov. 29, 1989

[30] Foreign Application Priority Data

Nov. 30, 1988 [GB] United Kingdom ............... 8827933

[51] Int. Cl.$^5$ .................... B44C 1/22; C23F 1/00; C03C 15/00; C03C 25/06
[52] U.S. Cl. ........................................ 156/643; 134/1; 156/646; 156/656; 156/667; 204/192.35; 252/79.1
[58] Field of Search ................. 134/1, 2, 31; 156/643, 156/646, 656, 667; 252/79.1; 204/192.32, 192.35

[56] References Cited

U.S. PATENT DOCUMENTS 4,698,130 10/1987 Restall et al. .................. 156/667 X
4,711,698 12/1987 Douglas ........................ 156/667 X

FOREIGN PATENT DOCUMENTS 2120278 11/1983 United Kingdom ............... 156/667

Primary Examiner—William A. Powell
Attorney, Agent, or Firm—Fleit, Jacobson, Cohn, Price, Holman & Stern

[57] ABSTRACT

A dry solder reflow process, in which metal surface oxides are removed from the solder surface by abstraction of the oxygen from the metal oxide by atomic hydrogen, the atomic hydrogen being created within an intense microwave frequency plasma of a gas containing hydrogen.

5 Claims, 1 Drawing Sheet

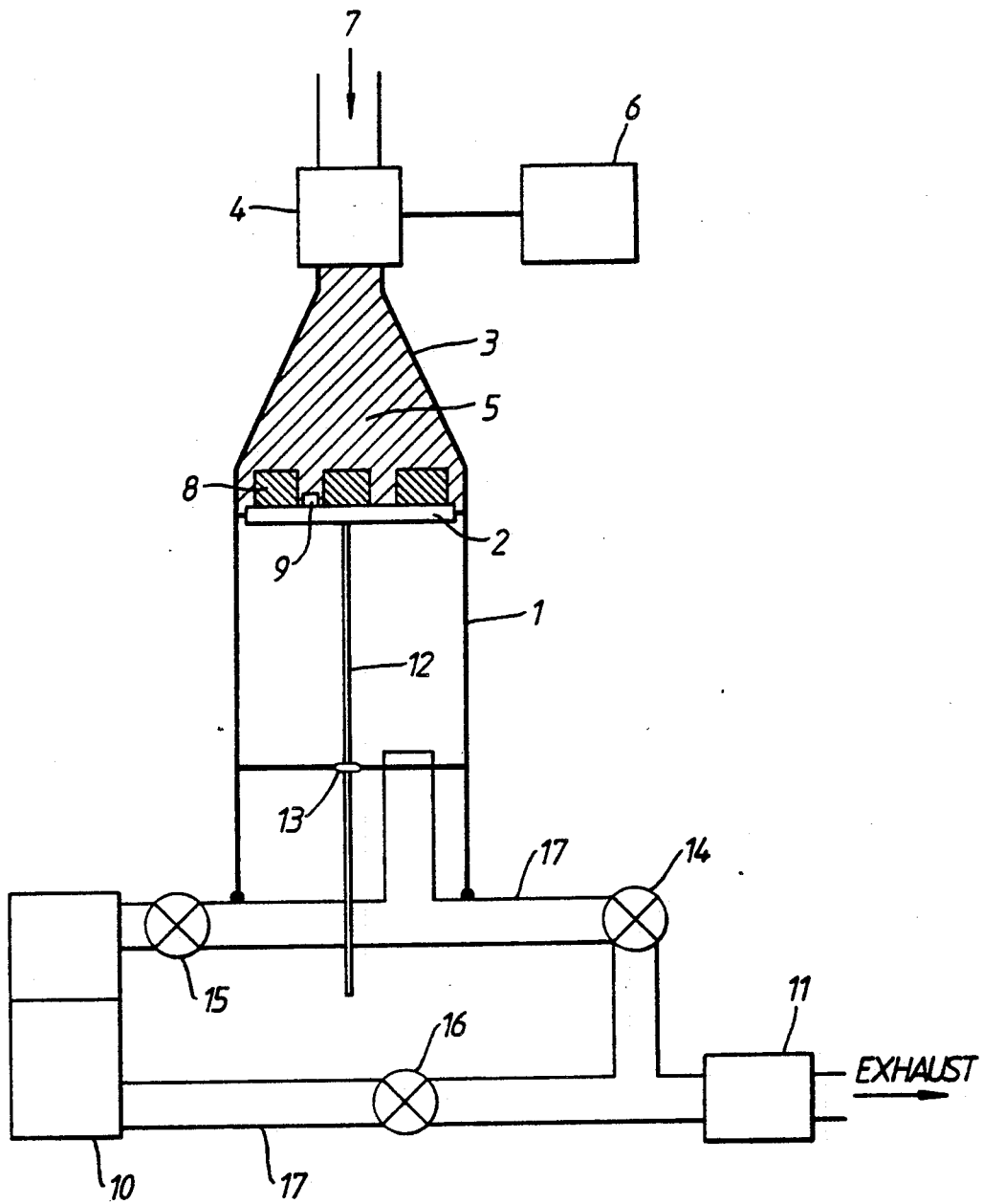

METAL SURFACE CLEANING PROCESSES

This invention relates to processes for cleaning metal surfaces by the removal of metal surface oxides and is especially, but not exclusively, applicable to the cleaning of metal surfaces in dry solder reflow processes. Dry solder reflow processes avoid the disadvantage of wet-processing in which the liquid fluxes used are not compatible with vacuum processing technology and may leave undesirable residues after solder reflow.

Dry solder reflow processes may be applied to flip-chip bonding. Flip-chip solder bonding is a true "area bonding" technology for use in microelectronics applications. In contrast to wire-bonding and tape-automated bonding techniques in which bonding locations are limited to the edges of chips, solder bonds may be located anywhere on the flip-chip component. The solder bonding process has been applied to silicon-on-silicon multi-chip modules with much smaller sizes than the same circuits fabricated using surface mount printed circuit board technology and also to various heterostructures such as thermal detector arrays in which large arrays of detectors of dissimilar materials are intimately bonded. Conventionally, liquid fluxes have been required for both solder reflow and bonding, leading to stringent cleaning requirements after bonding to remove potentially corrosive flux residues. The development of a reliable fluxless solder reflow and bonding process would avoid both the need to clean solder-bonded assemblies and the possibility of corrosive residues left after the bonding operation.

Dry process soldering relies upon the interaction of gas phase species with the native oxide, typically 10 nm thick, which coats the solder surface. As a result of this interaction, the oxide is converted into volatile products which are removed by gaseous flow. Recent work [1] on dry processing of lead-tin solders has revolve around the use of halogen containing gases such as $CF_2Cl_2$, $CF_4$ and $SF_6$. One disadvantage of these gases, however, is that although the oxide is effectively removed, halide residues can remain on the exposed surface of treated samples. These residues, when exposed to atmospheric moisture, can corrode the solder surface and any other exposed thin metal films. The etching action on the surface oxides may also adversely affect precise control of solder bond height, which can be a critical factor in certain applications. These undesirable effects in halogenated gases have led to the investigation in the present work of alternative dry 'fluxes' for solder reflow.

According to the present invention as broadly conceived there is provided a process for cleaning metal surfaces, in which metal oxides are removed from the metal surfaces by abstraction of oxygen from the metal oxide by atomic hydrogen which is created within an intense microwave frequency plasma of a gas containing hydrogen.

According to the present invention there is also provided a dry solder reflow process eminently suitable for use in flip-chip solder bonding applications, in which metal surface oxides are removed from the solder surface by abstraction of the oxygen from the metal oxide by atomic hydrogen, the atomic hydrogen being created within an intense microwave frequency plasma of a gas containing hydrogen (e.g. a mixture of an inert gas and hydrogen).

Plasma excitation frequencies >500 MHz are necessary to achieve significant quantities of atomic hydrogen species necessary for the process. The principal advantages are (i) the technique is vacuum compatible (ii) the "flux" gas is cheap and non-toxic (iii) no acidic residues are left after reflow (iv) the oxygen is abstracted rather than etched so no reaction with the metal solder occurs and (v) the sample does not acquire any significant charge (or potential difference with respect to the plasma) and hence damage by ion bombardment is avoided during sensitive electronics processing.

Two effects of interest may occur when atomic hydrogen interacts with an oxidised surface. Firstly, 'oxygen abstraction' may occur, whereby the hydrogen chemically reduces the surface oxides, converting itself to water vapour which is then pumped away. This mechanism applies in the case of Sn-Pb solders, where native oxides of tin and lead are reduced to the metallic state by the atomic hydrogen. The second case applies to silicon oxide surfaces: here the hydrogen reacts both with the oxygen and the silicon to form volatile products ($H_2O$ and $SiH_4$). In this case, etching of the surface will occur rather than simple chemical reduction.

By way of explanation of the process of the present invention it may here be mentioned that hydrogen is normally a diatomic molecule which as a gas has a reducing effect, albeit small, at the low temperatures involved in the soldering processes of interest here. The reactivity of hydrogen is significantly increased when the molecule is dissociated and atomic hydrogen created. Atomic hydrogen abstracts the oxygen from the surface oxide on the solder and forms OH or $H_2O$ species that are volatile and can be removed from the soldering area. Since the reaction products are non-acidic there is no corrosion of the solder surface or the vacuum equipment.

Molecular hydrogen can be dissociated into reactive atomic hydrogen by several techniques.

(a) W-filament
(b) Photo-dissociation
(c) Electrical discharge (a) A W-filament at ~2000° C. will dissociate $H_2$ into 2H° with an efficiency of ~7%, however, the W-filament also thermionically emits large quantities of electrons and heat, that could damage any Si circuitry and is therefore unsuitable for dry processing technologies.

(b) Photo-dissociation of $H_2$ occurs at wavelengths in the vacuum UV region of the spectrum. Excimer lasers have been used but the capital cost of the equipment is generally prohibitively high.

(c) Electrical discharges, in particular intense plasmas, can generate high concentrations of atomic hydrogen provided the plasma density is sufficiently high to cause significant dissociation. The dissociation of hydrogen by inelastic collisions with electrons requires an energy of 8.8 eV. The collision cross-section for this process is $\sim 1 \times 10^{-15}$ cm$^2$.

The use of a microwave frequency plasma in accordance with this invention has the advantage that it is capable of producing high degrees of ionisation (up to 10%) and electron densities ($10^{12}$–$10^{13}$ cm$^{-3}$) thus enhancing the $H_2$ dissociation rate. Microwave plasmas are regularly used in PECVD processes for the generation of $H^0$ [2, 3]. High plasma densities produce high concentrations of atomic species, which in turn results in a higher oxide removal rate and, therefore, a reduced processing time.

Thus, in considering the design of a hydrogen plasma based dry processing apparatus, an important criterion is the efficient production of a super-equilibrium concentration of $H^0$. The addition of Ar into a hydrogen plasma is expected to increase the concentration of $H^0$ in the following mechanisms:

$$Ar + plasma \rightarrow Ar^+ + e^-$$

$$Ar^+ + H_2 \rightarrow [ArH]^{++} + H^0$$

$$[ArH]^+ + e^- \rightarrow Ar^* + H^0$$

$$Ar^\circ + H_2 \rightarrow Ar^0 + H_2^*$$

$$H_2^* \rightarrow 2H^0$$

In addition to the above effect, the argon increases the plasma density, helping to maintain the discharge at low pressures.

Atomic hydrogen can only recombine to form the stable $H_2$ molecule by a third-body collision process [4]. The third body is generally the reactor walls and the design of the plasma vessel was considered to be an important factor that could affect the dry processing efficiency.

To keep oxygen impurities in the plasma to a minimum the dry processing apparatus was designed to operate at a pressure exceeding 10 mtorr with a chamber base pressure, prior to dry processing, of $10^{-5}$ torr.

By way of example reference will not be made to the accompanying drawing which shows an apparatus for carrying out the dry reflow solder process of the invention.

Referring to the drawing the apparatus consists of a cylindrical fused silica vacuum chamber 2" in diameter (1) arranged to be pumped by a rotary pump/oil diffusion pump combination (11) and (10). Within the chamber is an electrically heated platform (2) with a thermocouple (not shown) for temperature monitoring control. This platform (2) may be moved up or down within the chamber by moving its stem (12) through the 'O' ring seals (13) in the baseplate. At the top of the chamber is a conical section (3) leading to a small tunable microwave cavity (4) in which plasma (5) may be generated by a 200 W, 2.45 GHz microwave generator (6). An argon-hydrogen gas mixture (7) is introduced into the top of the microwave cavity, its flow rate being controlled by a precision needle valve. The gas flow sweeps atomic hydrogen species generated in the plasma (5) downwards to solder coated samples, such as sample chip (9) on the heated platform (2).

An earthed microwave shield in the form of a perforated plate (8) is used to screen the solder surface of the chip from the microwave frequency electric field and ensure that no surface charging of the solder (and underlying electronics) occurs.

In carrying out a dry solder reflow process using the apparatus shown in the drawing samples such as chip sample (9) are placed on the substrate heater platform (2) (e.g. 2" in diameter) and the reaction vessel (1) is evacuated to a base pressure of $10^{-5}$ torr. This is achieved by a liquid nitrogen trapped diffusion pump (10) and a rotary pump (11). The valves (14), (15) and (16) in the pumping circuit including ducting (17) are operated so that the valve (14) is initially operated when valves (15) and (16) are closed. In this way the chamber (1) is evacuated to a relatively low pressure by the rotary pump (11). The valve (14) is then closed and the chamber (1) evacuated to a lower pressure by the pumps (10) and (11) through the opened valves (15) and (16).

An atmosphere of $H_2/Ar$ is introduced at a pressure between 10–100 m torr and the samples heated to a temperature below the melting point of the 63:37 Eutectic Pb:Sn solder (i.e. 150°14 160° C.) as monitored by a Pt/PtRh thermocouple. At this point a 2.45 GHz plasma is struck within the reaction vessel, by the microwave generator (6) that has a maximum output power of 200 W. The hydrogen plasma (5) is then tuned so that for any given experimental conditions, it occupies a maximum volume in the reaction vessel above the sample platform (2). Heating is then continued to the solder reflow temperature, where it is held to allow oxide removal and reflow soldering to occur. Once this is achieved (after a period of less than 60 seconds), the plasma is switched-off and the samples allowed to cool under the $H_2/Ar$ atmosphere.

The apparatus functions as follows:

The input gases ($Ar + H_2$) enter the reactor as shown above the microwave plasma cavity region (4). An intense, microwave frequency electric field causes a break-down of these gases which then become a flow-discharge (or plasma) (5). Since the excitation frequency (2.45 Ghz) is of similar magnitude to the plasma oscillation frequency, a high degree of atomic species are present in the discharge. These atomic species ($AR^\circ$ and $H^\circ$) are swept down-stream by the action of the vacuum pumps (10) and (11) where they impinge upon the surface of the sample to be soldered. The atomic hydrogen "abstracts" oxygen from the surface oxide of both the solder and the surface to be soldered thereby leaving a clean metallic surface. The sample (9) is then heated to the melting point of the solder and reflow occurs under the above conditions.

In alternative processes according to the invention:
(1) the input gas (7) could be pure hydrogen or a mixture of any inert gas and hydrogen.
(2) A voltage (+ve with respect to the plasma) could be placed on the same shield to repel any +ve ions.
(3) A magnetic field could be applied to the plasma to give the electron cyclotron resonance ($\epsilon CR$) condition to further enhance plasma density.
(4) Sample to be soldered can be at any angle $\phi$ to the gas flow direction.

It will be understood from the foregoing description that although a solder reflow process is described by way of example the cleaning process utilised could be used in applications other than dry solder processes.

References

1. P. A. Moskowitz, H. L. Yeh and S. K. Ray, J. Vac. Sci. Technol. A4(3), May/June 1986, p. 838.
2. C. J. H. Worth, RP9-314 Annual Research Report, Nov. 1987–Oct. 1988.
3. J. Musil, Vacuum, Volume 36, No. 1–3 (161–169), 1986.
4. H. V. Boenig, "Fundamentals of Plasma Chemistry and Technology", Chapter VI, Technomic Publishing Company Inc. 1988.

We claim:
1. A cleaning process for the removal of surface metal oxides from metal surfaces of articles, comprising the steps of:
   positioning at least one article to be cleaned within a reaction chamber;

introducing a gas mixture containing hydrogen into a plasma generating microwave device to produce atomic hydrogen and causing the atomic hydrogen so produced to flow into the reaction chamber for the abstraction of oxygen from the surface metal oxides of said article.

2. A dry solder reflow process including a cleaning operation for the removal of surface metal oxides from solder surfaces of articles to be bonded by soldering, comprising the steps of:

positioning at least one article to be cleaned and dry soldered within a reaction chamber and heating said article;

introducing a gas mixture containing hydrogen into a plasma generating microwave cavity to produced atomic hydrogen and causing the atomic hydrogen so produced to flow into the reaction chamber for the abstraction of oxygen from said surface metal oxides as the temperature of the article within the reaction chamber is raised to the solder reflow temperature.

3. A process as claimed in claim 2, in which the gas comprises a mixture of an inert gas and hydrogen.

4. A process as claimed in claim 3, in which the inert gas is argon.

5. A dry solder reflow process as claimed in claim 2, in which the process is applied to flip-chip bonding.

* * * * *